United States Patent
Cho et al.

(10) Patent No.: US 11,139,786 B2
(45) Date of Patent: Oct. 5, 2021

(54) AMPLIFYING DEVICE WITH ADAPTIVE CTAT BIASING CONTROL

(71) Applicant: Samsung Electro-Mechanics Co., Ltd., Suwon-si (KR)

(72) Inventors: Je Hee Cho, Suwon-si (KR); Kyu Jin Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 33 days.

(21) Appl. No.: 16/726,327

(22) Filed: Dec. 24, 2019

(65) Prior Publication Data

US 2021/0091731 A1 Mar. 25, 2021

(30) Foreign Application Priority Data

Sep. 24, 2019 (KR) .................. 10-2019-0117719

(51) Int. Cl.
*H03F 1/30* (2006.01)
*H03F 3/213* (2006.01)

(52) U.S. Cl.
CPC .............. *H03F 3/213* (2013.01); *H03F 1/302* (2013.01); *H03F 2200/27* (2013.01)

(58) Field of Classification Search
CPC ................ H03F 1/30; H03F 3/20; H03G 3/30
USPC .................................................. 330/296, 285
See application file for complete search history.

(56) References Cited

U.S. PATENT DOCUMENTS

| | | | |
|---|---|---|---|
| 2001/0040482 A1* | 11/2001 | Dening | H03F 1/302 330/296 |
| 2004/0189398 A1 | 9/2004 | Noh et al. | |
| 2008/0238553 A1* | 10/2008 | Cho | H03F 1/32 330/296 |
| 2014/0285268 A1* | 9/2014 | Tsutsui | H03F 1/0205 330/296 |

FOREIGN PATENT DOCUMENTS

| | | |
|---|---|---|
| KR | 10-2002-0081655 A | 10/2002 |
| KR | 10-2003-0031073 A | 4/2003 |

* cited by examiner

*Primary Examiner* — Henry Choe
(74) *Attorney, Agent, or Firm* — NSIP Law

(57) ABSTRACT

An amplifying device includes a current generating circuit, a bias amplifying circuit, and a compensation circuit. The current generating circuit is configured to generate an internal current based on an internal voltage. The bias amplifying circuit, connected to the current generating circuit, is configured to output a bias current generated by amplifying the internal current to a power amplifying circuit. The compensation circuit, connected to the current generating circuit, is configured to adjust the internal voltage based on a bias voltage of the power amplifying circuit.

20 Claims, 3 Drawing Sheets

AMPLIFYING DEVICE WITH ADAPTIVE CTAT BIASING CONTROL

CROSS-REFERENCE TO RELATED APPLICATION(S)

This application claims the benefit under 35 USC 119(a) of priority to Korean Patent Application No. 10-2019-0117719 filed on Sep. 24, 2019 in the Korean Intellectual Property Office, the entire disclosure of which is incorporated herein by reference for all purposes.

BACKGROUND

1. Field

The following disclosure relates to an amplifying device with an adaptive complementary to absolute temperature (CTAT) biasing control.

2. Description of Related Art

In general, communication systems, such as mobile devices, including mobile phones, include an amplifying device to amplify a signal.

Typically, the amplifying device may include a bias circuit and an amplifying circuit, the bias circuit may generate a bias voltage or a bias current to be supplied to the amplifying circuit, while the amplifying circuit may receive a bias current or a bias voltage, and may amplify the input signal.

In a conventional amplifying device, the amplifying circuit includes a power transistor, and the bias circuit includes a bias transistor. While the amplifying device is operating, the temperature of the amplifying device may increase over time. Since the power transistor typically generates more current than the bias transistor, a case in which the temperature of the power transistor increases relatively higher than the temperature of the bias transistor may occur.

As a result of the temperature increment, a threshold voltage Vth of the power transistor may be relatively lower than a level to which a base-emitter voltage Vbe of the bias transistor is lowered. Accordingly, an overdrive voltage Vov corresponding to a difference voltage of a base-emitter voltage Vbe of the bias transistor and a threshold voltage Vth of the power transistor may increase. As the overdrive voltage Vov increases, the bias current increases, such that a collector current (or a quiescent current) of the amplifying current also increases, resulting in an increase in current consumption in the amplifying circuit.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an amplifying device includes a current generating circuit, a bias amplifying circuit, and a compensation circuit. The current generating circuit is configured to generate an internal current based on an internal voltage. The bias amplifying circuit, connected to the current generating circuit, is configured to output a bias current generated by amplifying the internal current to a power amplifying circuit. The compensation circuit, connected to the current generating circuit, is configured to adjust the internal voltage based on a bias voltage of the power amplifying circuit.

The current generating circuit may include a first constant voltage element having an anode connected to a terminal of a reference current source, and a ground resistor connected between a cathode of the first constant voltage element and a ground. The internal voltage may be output from the anode of the first constant voltage element.

The compensation circuit may be connected between an input node of the power amplifying circuit to which the bias current is supplied and the cathode of the first constant voltage element.

The current generating circuit may include a source resistor having one end connected to a terminal of a reference current source, a first constant voltage element having an anode connected to another end of the source resistor, a second constant voltage element having an anode connected to a cathode of the first constant voltage element and a ground resistor connected between a cathode of the second constant voltage element and a ground. The internal voltage may be output from the anode of the first constant voltage element.

The compensation circuit may be connected between the input node of the power amplifying circuit to which the bias current is supplied and the cathode of the first constant voltage element.

The compensation circuit may include a low pass filter configured to pass a direct current component and block an alternating current component.

The compensation circuit may include an RC filter configured to pass a direct current component and block an alternating current component.

The compensation circuit may include a resistor element connected between the input node of the power amplifying circuit to which the bias current is supplied and the cathode of the first constant voltage element, and a capacitor element connected between one of both terminals of the resistor element and the ground.

In another general aspect, an amplifying device includes a current generating circuit, a bias amplifying circuit, a power amplifying circuit, and a compensation circuit. The current generating circuit is configured to generate an internal current based on an internal voltage. The bias amplifying circuit, connected to the current generating circuit, is configured to output a bias current generated by amplifying the internal current. The power amplifying circuit is configured to receive the bias current from the bias amplifying circuit, and amplify an input signal. The compensation circuit is configured to adjust the internal voltage based on a bias voltage of the power amplifying circuit so that the bias current remains substantially constant as temperature changes from one temperature value to another temperature value. The power amplifying circuit is connected to the bias amplifying circuit and the compensation circuit.

The current generating circuit may include a first constant voltage element having an anode connected to a terminal of a reference current source, and a ground resistor connected between a cathode of the first constant voltage element and a ground. The internal voltage may be output from the anode of the first constant voltage element.

The compensation circuit may be connected between an input node of the power amplifying circuit to which the bias current is supplied and a cathode of the first constant voltage element.

The current generating circuit may include a source resistor having one end connected to a terminal of a reference current source, a first constant voltage element having an anode connected to another end of the source resistor, a second constant voltage element having an anode connected to a cathode of the first constant voltage element, and a ground resistor connected between the cathode of the second constant voltage element and a ground. The internal voltage may output from the anode of the second constant voltage element.

The compensation circuit may be connected between an input node of the power amplifying circuit to which the bias current is supplied and the cathode of the first constant voltage element.

The compensation circuit may include a low pass filter configured to pass a direct current component and block an alternating current component.

The compensation circuit may include an RC filter configured to pass a direct current component and block an alternating current component.

The compensation circuit may include a resistor element connected between an input node of the power amplifying circuit to which the bias current is supplied and an anode of the second constant voltage element, and a capacitor element connected between one of both terminals of the resistor element and a ground.

In another general aspect, amplifying device includes a current generating circuit, a bias amplifying circuit, a power amplifying circuit, and a compensation circuit. The current generating circuit is configured to generate an internal current based on an internal voltage. The bias amplifying circuit, connected to the current generating circuit, is configured to output a bias current generated by amplifying the internal current. The power amplifying circuit is configured to receive the bias current of the bias amplifying circuit. The compensation circuit, connected to the current generating circuit, is configured to adjust the internal voltage of the current generating circuit based on a bias voltage of the power amplifying circuit. The bias amplifying circuit and the compensation circuit are connected between the current generating circuit and the power amplifying circuit.

The current generating circuit may include a first constant voltage element having an anode connected to a terminal of a reference current source, and a ground resistor connected between a cathode of the first constant voltage element and a ground. The internal voltage may be output from the anode of the first constant voltage element.

The compensation circuit may be connected between an input node of the power amplifying circuit to which the bias current is supplied and the cathode of the first constant voltage element.

The compensation circuit may be further configured to adjust the internal voltage so that the bias current remains substantially constant as temperature changes from one temperature value to another temperature value.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
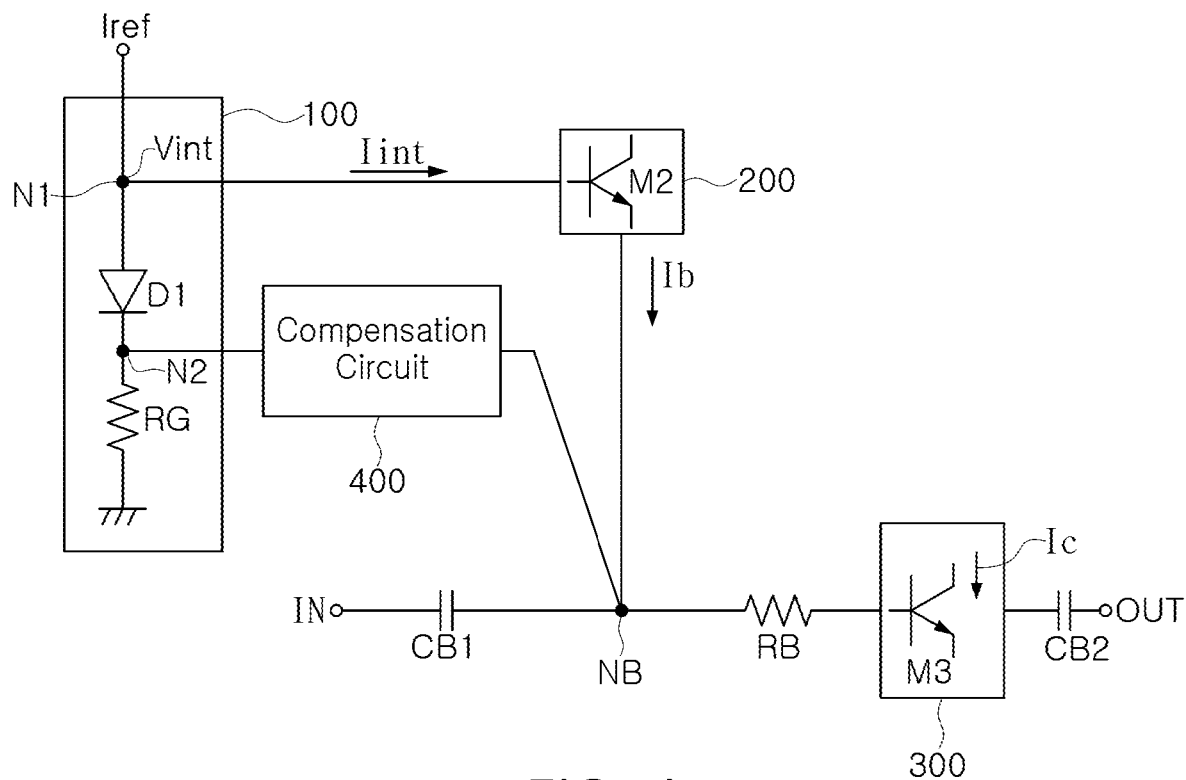
FIG. 1 is a diagram illustrating an example of an amplifying device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible, as will be apparent after an understanding of the disclosure of this application.

FIG. 1 is a diagram of an example of an amplifying device.

In FIG. 1, an amplifying device may include a current generating circuit 100, a bias amplifying circuit 200, and a compensation circuit 400.

In another example, the amplifying device may include a current generating circuit 100, a bias amplifying circuit 200, a power amplifying circuit 300, and a compensation circuit 400.

The current generating circuit 100 may generate an internal current Iint based on an internal voltage Vint.

For example, the current generating circuit 100 may include a first constant voltage element D1 and a ground resistor RG, connected between a terminal of a reference current source Iref and a ground in series.

The first constant voltage element D1 may include an anode connected to the terminal of the reference current source Iref and a cathode connected to the ground resistor RG. The ground resistor RG may be connected between the cathode of the first constant voltage element D1 and the ground. In this example, the internal voltage Vint may be output from the anode (a first node (N1)) of the first constant voltage element D1.

The bias amplifying circuit 200 may be connected to the first node N1 of the current generating circuit 100, amplify the internal current Iint received from the current generating circuit 100, and generate a bias current Ib and output it to the power amplifying circuit 300. For example, the bias amplifying circuit 200 may include a bias transistor M2.

The power amplifying circuit 300 may receive the bias current Ib from the bias amplifying circuit 200, amplify an input signal sequentially input through an input terminal IN and an input blocking capacitor CB1, and the amplified signal may be sequentially output through an output blocking capacitor CB2 and an output terminal OUT. For example, the power amplifying circuit 300 may include a power transistor M3.

In FIG. 1, since the input blocking capacitor CB1 and the output blocking capacitor CB2 have low impedance with respect to an AC signal, the input blocking capacitor CB1 and the output blocking capacitor CB2 pass the AC signal and block a DC component since the input blocking capacitor CB1 and the output blocking capacitor CB2 have high impedance with respect to the DC component. RB is a base resistor of the power amplifying circuit 300.

The compensation circuit 400 may transfer the bias voltage Vb at the input node NB of the power amplifying circuit 200 to the second node N2 of the current generating circuit 100 (a first constant voltage element (a cathode of D1)) and may adjust the internal voltage Vint of the current generating circuit 100 based on the bias voltage Vb.

For example, the compensation circuit 400 may be connected between an input node NB of the power amplifying circuit 300 to which the bias current Ib is supplied and a second node N2 corresponding to a cathode of the first constant voltage element D1. Accordingly, the compensation circuit 400 may transfer a base voltage Vb at the input node NB of the power amplifying circuit 300 to the second node N2.

For each of the drawings of the present disclosure, redundant descriptions of the same reference numerals and components of the same function may be omitted, and details of possible differences may be described for each of the drawings.

Figure 2:
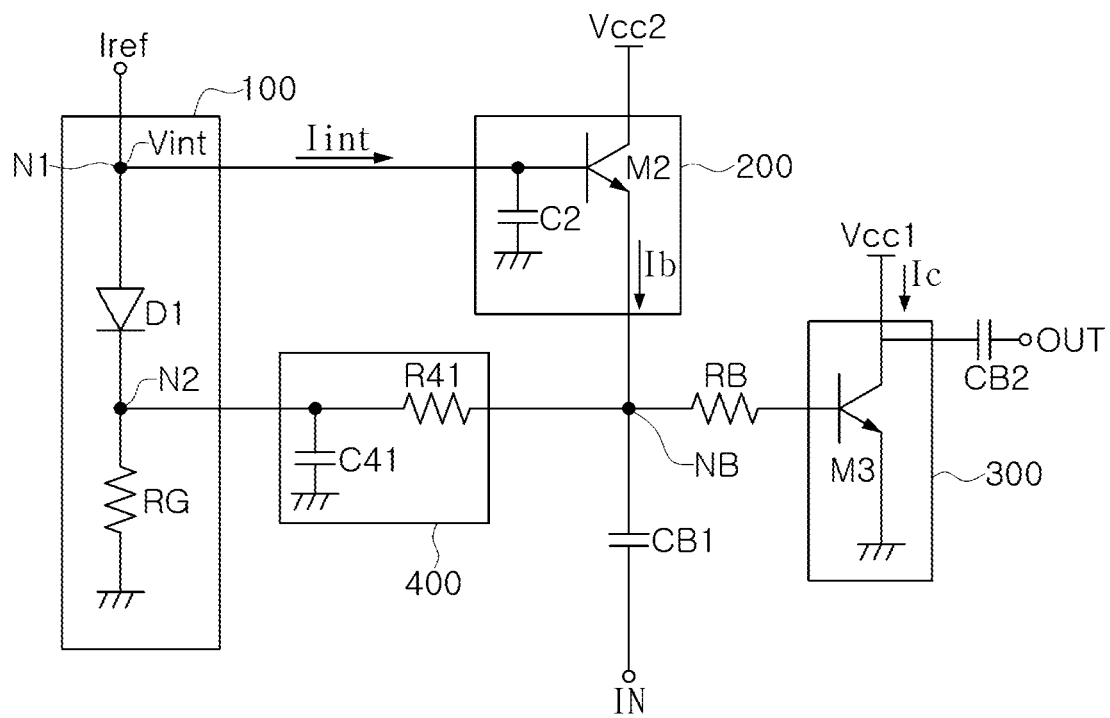
FIG. 2 is a circuit diagram of an example of an amplifying device.

FIG. 2 is a circuit diagram of an example of an amplifying device.

In FIG. 2, the bias amplifying circuit 200 may include, for example, a bias transistor M2 and a capacitor C2. The bias transistor M2 may be, for example, a bipolar junction transistor (BJT) or a hetero-junction bipolar transistor (HBT), but is not limited thereto.

For example, the bias transistor M2 may include a collector connected to an operating voltage (Vcc2) terminal, a base connected to a first node N1 corresponding to an anode of the first constant voltage element D1, and an emitter connected to an input node NB of the power amplifying circuit 300. The capacitor C2 may be connected between the base of the bias transistor M2 and a ground.

A base voltage of the bias transistor M2 of the capacitor C2 may be stabilized. The bias transistor M2 may amplify the internal current Iint input from the current generating circuit 100 to generate a bias current Ib and supply the bias current Ib to the input node NB of the power amplifying circuit 300.

For example, the power amplifying circuit 300 may include a power transistor M3. The power transistor M3 may be, for example, a bipolar junction transistor (BJT) or a hetero-junction bipolar transistor (HBT), but is not limited thereto.

The power transistor M3 may include a collector connected to an operating voltage (Vcc1) terminal, a base connected to an input node NB of the power amplifying circuit 300 through the base register RB, and an emitter connected to a ground.

The power transistor M3 may receive the bias current Ib from the bias amplifying circuit 200, and amplify an input signal input to the base through the input terminal IN.

The compensation circuit 400 may include a low pass filter such as an RC filter that passes a DC component and blocks an AC component.

The compensation circuit 400 may include, for example, a resistor element R41 and a capacitor element C41. The resistor element R41 may be connected between the input node NB of the power amplifying circuit 300 to which the bias current Ib is supplied and the anode of the first constant voltage element D1 (a first node (N1)). The capacitor element C41 may be connected between one of both terminals of the resistor element R41 and a ground.

In general, when temperature increases, the threshold voltage of the power transistor M3 decreases. When the threshold voltage of the power transistor M3 decreases, a base voltage Vb of the power transistor M3 also decreases, and when the base voltage Vb is transferred to the second node N2 of the current generating circuit 100 by the compensation circuit 400, the internal voltage Vint also decreases.

Accordingly, when the internal voltage Vint is also lowered, an increase in the internal current Iint may be suppressed by suppressing an increase in an overdrive voltage Vov corresponding to a difference voltage of the base-emitter voltage Vbe of the bias transistor M2 and the threshold voltage Vth of the power transistor M3.

Accordingly, the compensation circuit 400 may adjust the internal voltage Vint based on the bias voltage Vb of the power amplifying circuit 300 such that the bias current Ib is substantially constant, regardless of a change in temperature, and may eventually adjust the bias current to be constant. In other words, for example, as temperature changes from one temperature value to another different temperature value, the compensation circuit 400 may adjust the internal voltage Vint based on the bias voltage Vb of the power amplifying circuit 300 such that the bias current Ib is substantially constant.

The resistor element R41 of the compensation circuit 400 may have a resistance value that is high enough so that the current does not flow in terms of DC. In this case, since the bias current Ib, which is a DC current, flows to the base of the power transistor M3 and does not flow through the compensation circuit 400, there is no voltage drop in the compensation circuit 400.

Accordingly, the compensation circuit 400 may transfer the base voltage Vb to the second node N2 of the current generating circuit 100.

Figure 3:
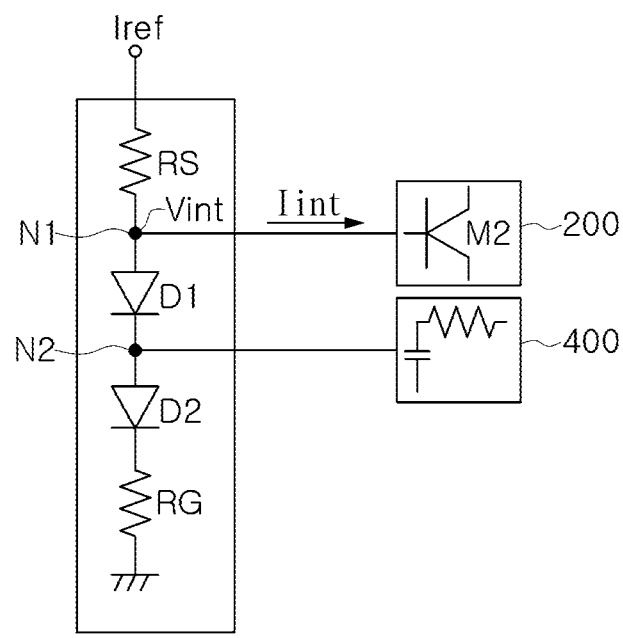
FIG. 3 is a diagram of the current generating circuit of FIG. 2.

FIG. 3 is a diagram of the current generating circuit of FIG. 2.

Referring to FIG. 3, as an example, the current generating circuit 100 may include a source resistor RS, connected between a terminal of a reference current source Iref and a ground in series, a first constant voltage element D1, a second constant voltage element D2, and a ground resistor RG.

The source resistor RS includes one end connected to the terminal of reference current source Iref and the other end connected to the anode of the first constant voltage element D1.

The first constant voltage element D1 includes an anode connected to the other end of the source resistor R2 and a cathode connected to the anode of the second constant voltage element D2.

The second constant voltage element D2 includes an anode connected to the cathode of the first constant voltage element D1 and a cathode connected to the ground resistor RG. For example, the first constant voltage element D1 and the second constant voltage element D2 may be diodes, and diode connection transistors, but is not limited thereto, and may be replaced with an element or a circuit having a constant voltage function.

The ground resistor RG is connected between the cathode of the second constant voltage element D2 and the ground.

The internal voltage Vint may be output from the anode (first node (N1)) of the first constant voltage element D1.

In this example, the compensation circuit 400 is connected between the input node NB of the power amplifying circuit 300 to which the bias current Ib is supplied and the cathode of the first constant voltage element D1 (second node N2, which is a connection node between the first constant voltage element D1 and the second constant voltage element D2).

In the present specification, the node to which the compensation circuit 400 is connected is not limited to the input node (NB, in FIG. 2) and the second node (N2 in FIG. 2 or FIG. 3), may be a node that can detect the threshold voltage of the power transistor M3 instead of the input node NB, and may be a node that can adjust the internal voltage Vint, which is a different node from the first node for supplying the internal voltage Vint instead of the second node N2.

Accordingly, the compensation circuit 400 may transfer a bias voltage Vb at the input node NB of the power amplifying circuit 300 to the second node N2, which is a connection node between the first constant voltage element D1 and the second constant voltage element D2, and may adjust the internal voltage Vint of the current generating circuit 100 based on the bias voltage Vb.

In other words, the compensation circuit 400 may transfer a base voltage Vb corresponding to the threshold voltage of the power amplifying circuit 300 that decreases when the temperature increases to the second node N2 of the current generating circuit 100, and may adjust the internal voltage Vint of the first node N1 of the current generating circuit 100. Subsequently, the internal voltage Vint of the first node N1 of the current generating circuit 100 tracks the threshold voltage of the power amplifying circuit 300, and thus the base-emitter voltage also tracks the threshold voltage of the power amplifying circuit 300, such that an increase in a Vov voltage, which is a difference voltage between the threshold voltage of the power amplifying circuit 300 and the base-emitter voltage of the bias amplifying circuit 200 may be suppressed. Accordingly, an increase in a collector current (or a quiescent current) of the power amplifying circuit 300 may be suppressed.

Figure 4:
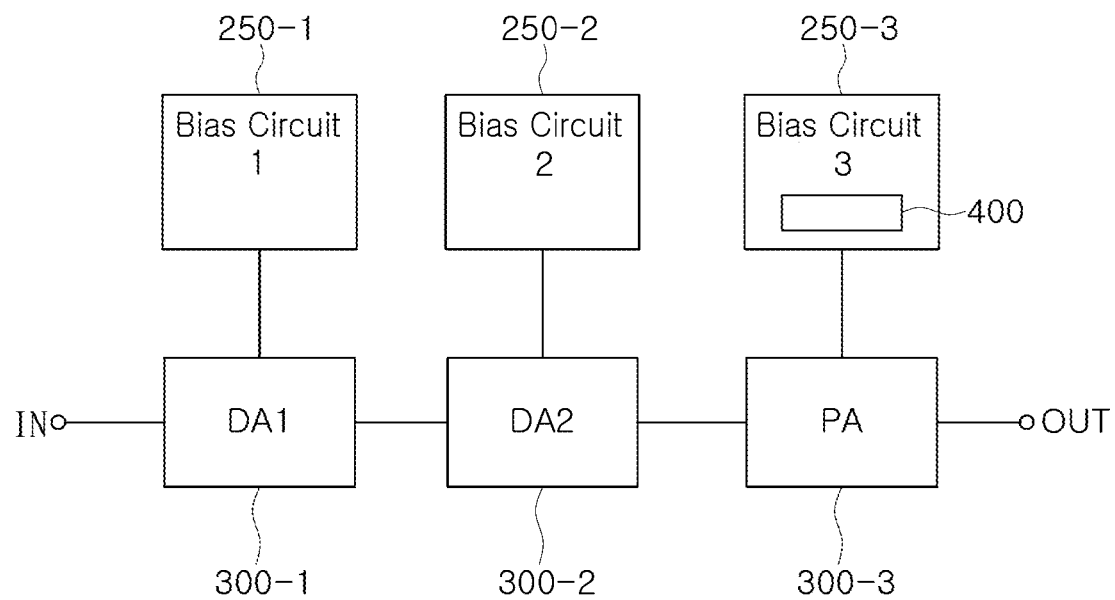
FIG. 4 is a diagram illustrating an example of an application of an amplifying device.

FIG. 4 is a diagram illustrating an example of an application of an amplifying device.

In FIG. 4, an amplifying device according to an embodiment of the present disclosure may include a plurality of amplifying circuits 300-1, 300-2, and 300-3 and a plurality of bias circuits 250-1, 250-2, and 250-3. In this example, the plurality of amplifying circuits 300-1, 300-2, and 300-3 may receive a bias current from each of the plurality of bias circuits 250-1, 250-2, and 250-3.

For example, the plurality of amplifying circuits 300-1, 300-2, and 300-3 may be a first drive amplifier DA1 (300-1), a second drive amplifier DA2 (300-2), and a power amplifier PA (300-3), respectively. In this example, the compensation circuit 400 as described above may be applied to each of the first driver amplifier DA1 (300-1), the second drive amplifier DA2 (300-2), and the power amplifier PA (300-3). For example, as shown in FIG. 4, the compensation circuit 400 may only be applied to the power amplifier PA (300-3) having the highest power consumption.

Figure 5:
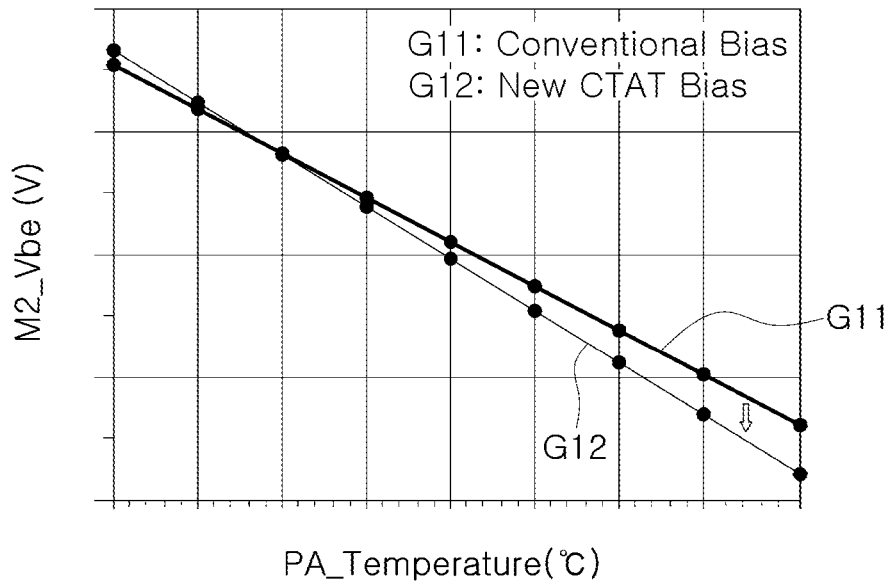
FIG. 5 is a graph of examples of a base-emitter voltage (Vbe) of a temperature-bias transistor of the power amplifying circuit.

FIG. 5 is a graph of examples of a base-emitter voltage (Vbe) of a temperature-bias transistor of a power amplifying circuit.

In FIG. 5, G11 is a graph of Vbe of the temperature-bias transistor of the conventional power amplifying circuit without the compensation circuit, and G12 is a graph of Vbe of the temperature-bias transistor of the power amplifying circuit of the present disclosure having the compensation circuit.

Referring to G11 and G12, in the power amplifying circuit of the present disclosure compared to the conventional power amplifying circuit, it can be seen that Vbe of the bias transistor is relatively lower as the temperature increases, and an increase in the overdrive voltage (Vov), which is a difference voltage between the threshold voltage of the power amplifying circuit 300 and the base-emitter voltage of the bias amplifying circuit 200 may be suppressed.

When the increase in the Vov voltage is suppressed, an increase in the bias current is effectively suppressed.

Figure 6:
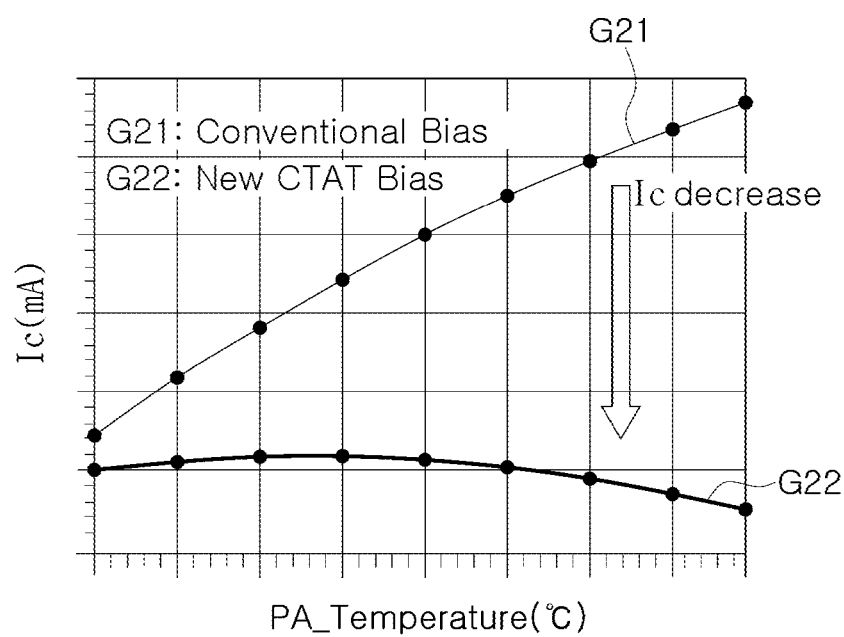
FIG. 6 is a graph of examples of a collect current (Ic) of a temperature power transistor of the power amplifying circuit.

FIG. 6 is a graph of examples of a collect current (Ic) of a temperature-power transistor of a power amplifying circuit.

In FIG. 6, G21 is a graph of Ic of the temperature-power transistor of the conventional power amplifying circuit without the compensation circuit, and G22 is a graph of Ic of the temperature-power transistor of the power amplifying circuit of the present disclosure having the compensation circuit.

Referring to G21 and G22, in the power amplifying circuit of the present disclosure when compared to a conventional power amplifying circuit, it can be seen that Ic of the power transistor does not increase with temperature and is relatively constant as temperature increases.

Accordingly, even as temperature increases, the collector current of the power amplifying circuit is suppressed from increasing by the compensation circuit of the present disclosure, such that an increase in current consumption may be prevented.

As set forth above, according to the examples of the present disclosure, even when temperature increases while an amplifying device is operating, an increase in a bias current of a bias circuit or a collector current of an amplifying circuit may be suppressed, thereby reducing current consumption.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An amplifying device, comprising:
    a current generating circuit, configured to generate an internal current based on an internal voltage, comprising a first constant voltage element and a ground resistor connected between a terminal of a reference current source and a ground, wherein the ground resistor is connected between the first constant voltage element and the ground;
    a bias amplifying circuit configured to output a bias current generated by amplifying the internal current to a power amplifying circuit; and
    a compensation circuit, configured to adjust the internal voltage based on a bias voltage of the power amplifying circuit, connected to a node between the first constant voltage element and the ground resistor.

2. The amplifying device of claim 1, wherein the first constant voltage element has an anode connected to the terminal of the reference current source, the ground resistor is connected between a cathode of the first constant voltage element and the ground, and the internal voltage is output from the anode of the first constant voltage element.

3. The amplifying device of claim 2, wherein the compensation circuit is connected between an input node of the power amplifying circuit to which the bias current is supplied and the cathode of the first constant voltage element.

4. The amplifying device of claim 1, wherein the current generating circuit further comprises:
    a source resistor having one end connected to the terminal of the reference current source, wherein the first constant voltage element has an anode connected to another end of the source resistor; and
    a second constant voltage element having an anode connected to a cathode of the first constant voltage element, wherein the ground resistor is connected between a cathode of the second constant voltage element and the ground, and the internal voltage is output from the anode of the first constant voltage element.

5. The amplifying device of claim 4, wherein the compensation circuit is connected between the input node of the power amplifying circuit to which the bias current is supplied and the cathode of the first constant voltage element.

6. The amplifying device of claim 1, wherein the compensation circuit comprises a low pass filter configured to pass a direct current component and block an alternating current component.

7. The amplifying device of claim 1, wherein the compensation circuit comprises an RC filter configured to pass a direct current component and block an alternating current component.

8. The amplifying device of claim 4, wherein the compensation circuit comprises,
    a resistor element connected between the input node of the power amplifying circuit to which the bias current is supplied and the cathode of the first constant voltage element; and
    a capacitor element connected between one of both terminals of the resistor element and the ground.

9. An amplifying device, comprising:
    a current generating circuit, configured to generate an internal current based on an internal voltage, comprising a first constant voltage element and a ground resistor connected between a terminal of a reference current source and a ground, wherein the ground resistor is connected between the first constant voltage element and the ground;
    a bias amplifying circuit configured to output a bias current generated by amplifying the internal current;
    a power amplifying circuit configured to receive the bias current from the bias amplifying circuit, and amplify an input signal; and
    a compensation circuit configured to adjust the internal voltage based on a bias voltage of the power amplifying circuit so that the bias current remains substantially constant as temperature changes from one temperature value to another different temperature value, wherein the compensation circuit is connected to a node between the first constant voltage element and the ground resistor.

10. The amplifying device of claim 9, wherein the first constant voltage element has an anode connected to the terminal of the reference current source,
    the ground resistor is connected between a cathode of the first constant voltage element and the ground, and
    the internal voltage is output from the anode of the first constant voltage element.

11. The amplifying device of claim 10, wherein the compensation circuit is connected between an input node of the power amplifying circuit to which the bias current is supplied and a cathode of the first constant voltage element.

12. The amplifying device of claim 9, wherein the current generating circuit further comprises:
    a source resistor having one end connected to the terminal of the reference current source, wherein the first constant voltage element has an anode connected to another end of the source resistor; and
    a second constant voltage element having an anode connected to a cathode of the first constant voltage element, wherein the ground resistor is connected between the cathode of the second constant voltage element and the ground, and the internal voltage is output from the anode of the second constant voltage element.

13. The amplifying device of claim 12, wherein the compensation circuit is connected between an input node of the power amplifying circuit to which the bias current is supplied and the cathode of the first constant voltage element.

14. The amplifying device of claim 9, wherein the compensation circuit comprises a low pass filter configured to pass a direct current component and block an alternating current component.

15. The amplifying device of claim 9, wherein the compensation circuit comprises an RC filter configured to pass a direct current component and block an alternating current component.

16. The amplifying device of claim 12, wherein the compensation circuit comprises:
   a resistor element connected between an input node of the power amplifying circuit to which the bias current is supplied and an anode of the second constant voltage element; and
   a capacitor element connected between one of both terminals of the resistor element and the ground.

17. An amplifying device, comprising:
   a current generating circuit, configured to generate an internal current based on an internal voltage, comprising a first constant voltage element and a round resistor connected between a terminal of a reference current source and a ground, wherein the round resistor is connected between the first constant voltage element and the ground;
   a bias amplifying circuit, connected to the current generating circuit, configured to output a bias current generated by amplifying the internal current;
   a power amplifying circuit configured to receive the bias current of the bias amplifying circuit; and
   a compensation circuit, connected to the current generating circuit, configured to adjust the internal voltage of the current generating circuit based on a bias voltage of the power amplifying circuit,
   wherein the bias amplifying circuit and the compensation circuit are connected between the current generating circuit and the power amplifying circuit, and the compensation circuit is connected to a node between the first constant voltage element and the ground resistor.

18. The amplifying device of claim 17, wherein the
   first constant voltage element has an anode connected to the terminal of the reference current source,
   the ground resistor is connected between a cathode of the first constant voltage element and the ground, and
   the internal voltage is output from the anode of the first constant voltage element.

19. The amplifying device of claim 18, wherein the compensation circuit is connected between an input node of the power amplifying circuit to which the bias current is supplied and the cathode of the first constant voltage element.

20. The amplifying device of claim 17, wherein the compensation circuit is further configured to adjust the internal voltage so that the bias current remains substantially constant as temperature changes from one temperature value to another temperature value.

* * * * *